United States Patent [19]
Chen et al.

[11] Patent Number: 5,903,052
[45] Date of Patent: May 11, 1999

[54] STRUCTURE FOR SEMICONDUCTOR PACKAGE FOR IMPROVING THE EFFICIENCY OF SPREADING HEAT

[75] Inventors: Lung-Tai Chen; Ping-Huang Chiang, both of Hsinchu; Yu-Kon Chou; Chien-Chi Chao, both of Taipei, all of Taiwan

[73] Assignee: Industrial Technology Research Institute, Hsinchu Hsien, Taiwan

[21] Appl. No.: 09/075,879

[22] Filed: May 12, 1998

[51] Int. Cl.⁶ .......................... H01L 23/495; H01L 23/12
[52] U.S. Cl. .................. 257/706; 257/73.7; 257/738; 257/712; 257/797; 257/713
[58] Field of Search ..................... 257/706, 712, 257/713, 717, 720, 734, 737, 735, 675, 797, 673, 676

[56] References Cited

U.S. PATENT DOCUMENTS

| | | | |
|---|---|---|---|
| 5,285,352 | 2/1994 | Pastore et al. | 257/712 |
| 5,430,331 | 7/1995 | Hamzehdoost et al. | 257/675 |
| 5,442,234 | 8/1995 | Liang | 257/675 |
| 5,528,458 | 6/1996 | Yasuho et al. | 257/713 |
| 5,541,450 | 7/1996 | Jones et al. | 257/738 |
| 5,583,377 | 12/1996 | Higgins, III | 257/713 |
| 5,583,378 | 12/1996 | Marrs et al. | 257/712 |
| 5,633,783 | 5/1997 | Yamamoto | 257/713 |
| 5,640,047 | 6/1997 | Nakashima | 252/738 |
| 5,710,695 | 1/1998 | Manteghi | 257/675 |
| 5,717,252 | 2/1998 | Nakashima et al. | 257/738 |
| 5,760,465 | 6/1998 | Alcoe et al. | 257/738 |

*Primary Examiner*—Alexander Oscar Williams
*Attorney, Agent, or Firm*—McDermott, Will & Emery

[57] ABSTRACT

The present invention includes a substrate having a first opening. A heat spreader is attached on the bottom surface of the substrate. The bottom side surface of the heat spreader has trench pattern. The trench pattern includes a plurality of connecting cavities and a plurality of trenches. The chip is mounted on the top side surface of the heat spreader. A supporting member is formed on the top side surface of the substrate. The space among the substrate, the chip, the heat spreader and the supporting member is encapsulated by encapsulating material. The preformed solder balls are mounted on the bottom side surface of the substrate.

16 Claims, 3 Drawing Sheets

STRUCTURE FOR SEMICONDUCTOR PACKAGE FOR IMPROVING THE EFFICIENCY OF SPREADING HEAT

FIELD OF THE INVENTION

The present invention relates to a semiconductor package, and more specifically, to a package which has improved capability of spreading heat.

BACKGROUND OF THE INVENTION

It has been a trend in the field of making semiconductor devices to increase the packing density of a silicon wafer. IC designers are continuously tempted to scale down the size of each device and increase chip level integration at an ever faster pace. Further, the manufacturers of the devices are striving to reduce the sizes while simultaneously increasing their speed.

As the semiconductor production continuously grows, more types of package are developed. One of the most notable is the plastic molded package, such as described in U.S. Pat. No. 5,586,010. The renewed interest in high density hybrid is driven by the requirement to handle large numbers of IC interconnections, the increasing clock rate of digital systems and the desire to pack greater functionality into smaller spaces. Therefore, the number of a package's leads becomes more and more. An important consideration in making small, high speed and high density devices is providing packages capable of the spreading heat generated by the devices. A further problem confronting the technology is the relentless need for more I/O per chip. A conventional lead frame package, such as SOP, PQFP, has a limitation to increase the number of the package's lead.

VLSI integrated circuits packages having high connection capacity are pin grid array (PGA) and ball grid array (BGA). One such package type is plastic ball grid array (PBGA) that uses a bismaleimidetraizine (BT) as a substrate. The PBGA offers many advantages over conventional packages such as solder ball I/O and high speed. The PBGA package has high speed due to a short path for signal transformation. The solder balls are set on a package surface in a matrix array which can provide more signal contacts.

Connections are made form bond pads of a semiconductor die to contact pads of wiring bonds. Conductive metal patterns connect to the solder balls of the BGA package. The package has a die and a housing for protection of the die. The semiconductor die is covered by an encapsulated cap.

Although the PBGA has a shorter path for spreading heat than a conventional package, but the substrate of the PBGA is made of BT so that the efficiency of spreading heat is poorer than the leadframe package. In order to solve the problem, pad array semiconductor devices have been proposed (see U.S. Pat. No. 5,285,352). The structure uses a thermal conductor in a pad array device permits routing of conductive traces and terminals beneath a semiconductor die for improved utilization of substrate area. An opening and a thermal conductor are set under the die on BT substrate. The heat that is generated by devices is dissipated to computer board via silver epoxy, the opening and a metal ground plane.

A ball grid array package having integral bumps is described in U.S. Pat. No. 5,629,835 entitled "METAL BALL GRID ARRAY PACKAGE WITH IMPROVED THERMAL CONDUCTIVITY" by Mahulikar et al. The purpose of art is to provide a lead frame having outer lead pins substantially perpendicular to the inner lead portion.

Unfortunately, the structure of the conventional package can not meet the requirement of the trend. Further, the efficiency of spreading heat is poor. Thus, what is required is an improved package with good efficiency of spreading heat.

SUMMARY OF THE INVENTION

An object of the present invention is to provide a package having good efficiency of spreading heat.

An other object of the present invention is to provide a package having trench pattern formed on the bottom side surface of a heat spreader.

The package is a semiconductor package that includes a substrate, a semiconductor chip and a heat spreader. The substrate has a first opening formed in the a portion of the substrate, the substrate comprises two layers. The first layer is formed on the second layer. The first layer has a plurality of conductive trace to provide electrical conductive path for signal transfer. A heat spreader is attached on the bottom surface of the substrate. The bottom side surface of the heat spreader has trench pattern. The trench pattern includes a plurality of connecting cavities and a plurality of trenches. The chip is mounted on the top side surface of the heat spreader. The chip is electrically coupled to the conductive traces by using the bonding wires.

A dielectric supporting member is formed on a portion of the top side surface of the substrate. The space among the substrate, the chip, the heat spreader and the dielectric supporting member is encapsulated by encapsulating material. Ball grid array (BGA) is formed on the bottom side surface of the substrate for electrically coupling to the chip.

DETAILED DESCRIPTION OF THE PREFERRED EMBODIMENT

Figure 1:
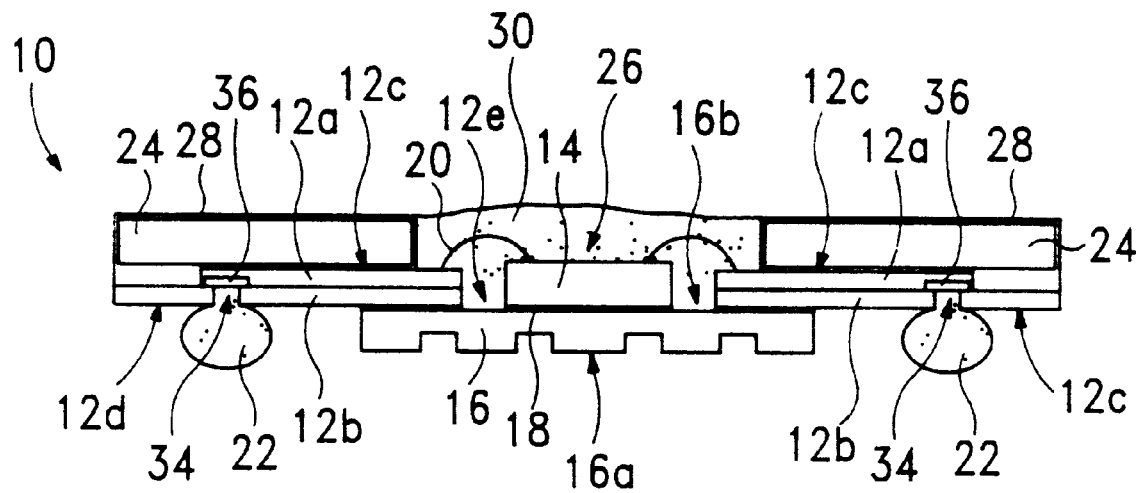
FIG. 1 is a cross sectional view of a structure of a package in accordance with the present invention.

The present invention discloses a structure of a semiconductor package for improving the efficiency of spreading heat. FIG. 1 is a cross section view of an embodiment of a package 10 according to the present invention. The package 10 is a semiconductor package that includes a substrate that is consisted of a layer 12a having conductive trace formed therein, a dielectric tape layer 12b, a semiconductor chip 14 and a heat spreader 16. The conductive layer 12a is formed on the dielectric tape layer. The substrate has a first major surface 12c and a second major surface 12d formed on thereon. The first major surface 12c is referred to a top side surface of the layer having conductive trace 12a and the second major surface 12d is referred to a bottom side surface of the dielectric tape layer 12b. The layer 12a, the dielectric tape layer 12b have a first opening 12e formed in the central portion of the both layers 12a, 12b. In the preferred embodiment, the layer having conductive trace 12a of the substrate is flexible printed circuit (PC). The layer 12a has a plurality of conductive trace (not shown) formed therein to provide electrical conductive path for signal transfer. The material used for the substrate can be a kind of dielectric, for example, polyimide, triazine, phenolic resin or bismaleimidetriazine (BT). Of course, any suitable material can be used for acting as the substrate. The conductive trace can be selected from gold or conductive metal or alloy.

Still turning to FIG. 1, the heat spreader 16 is attached on the bottom surface (second major surface) 12d of the substrate 12a, 12b by means of adhesive material. General speaking, the chip 14 generates a lot of heat during operation. The heat spreader 16 promotes thermal generated by the chip 14 away from the chip 14. Typically, the heat spreader is formed of a kind of metal or alloy that has low thermal resistance. The bottom side surface 16a of the heat spreader 16 has trench pattern formed therein.

Figure 2:
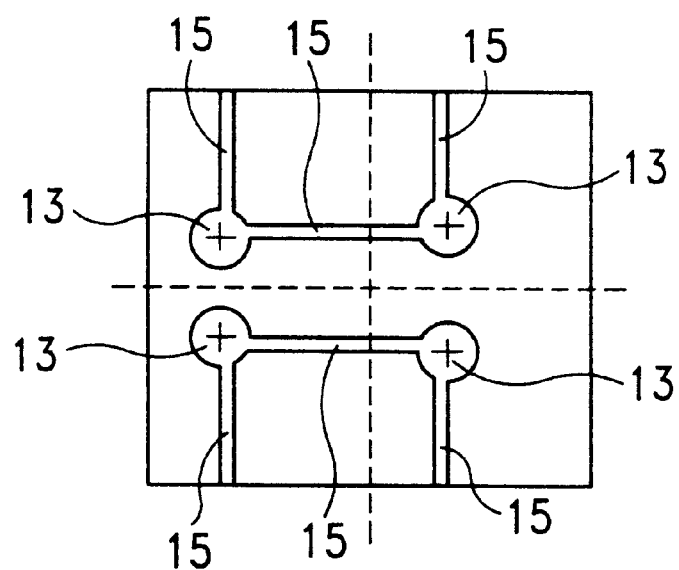
FIG. 2 is a scheme of a trench pattern in accordance with the present invention.
Figure 2:
Figure 3:
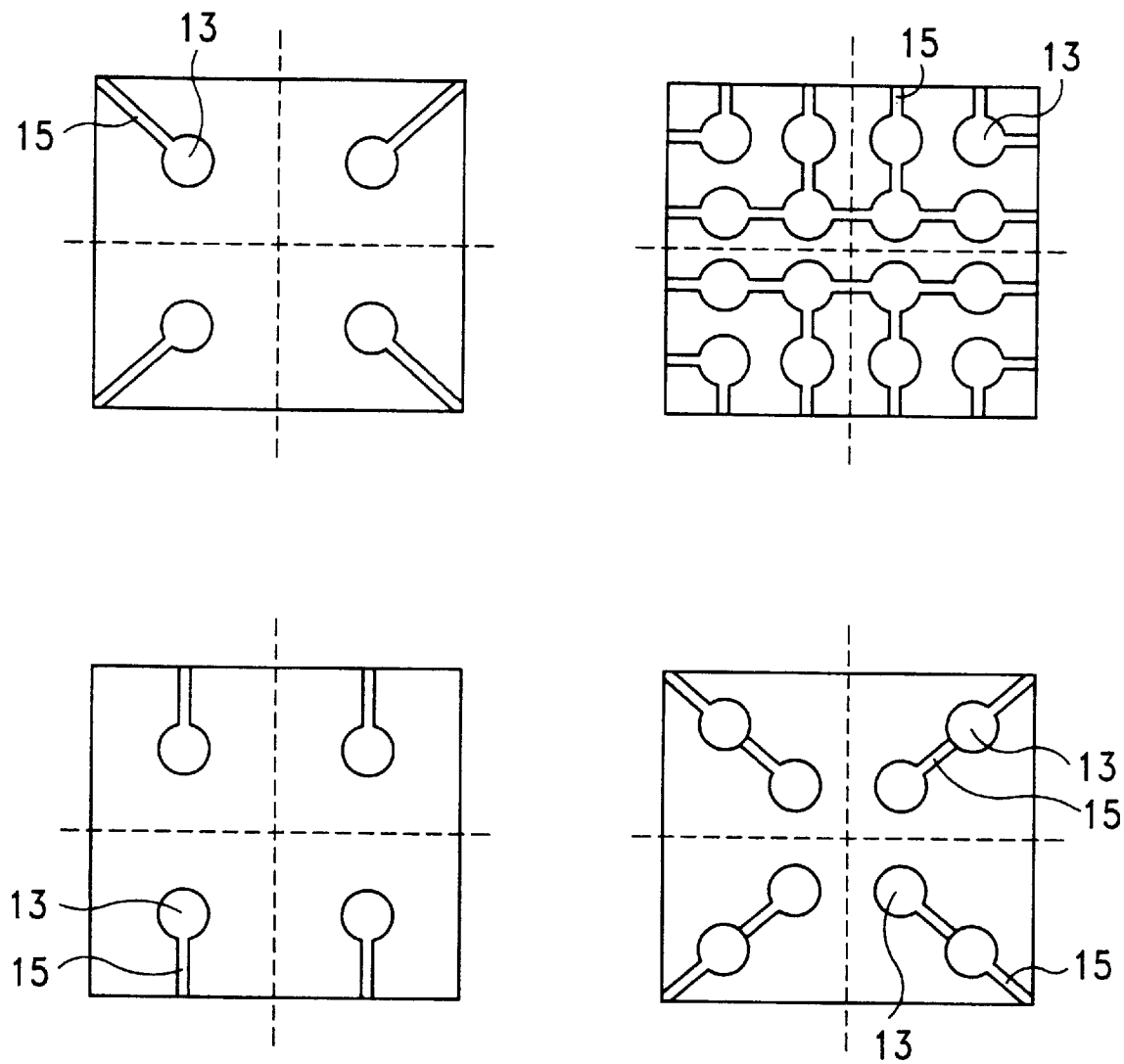
FIG. 3 is other embodiments of the trench pattern in accordance with the present invention.

As shown in FIG. 2, the trench pattern includes a plurality of connecting cavities 13 and a plurality of trenches 15 for exhausting gas generated during subsequent SMT (surface mount technology) process. The connecting cavities 13 are used to firmly connect the package 10 to a printed circuit board (PCB) by means of solder paste, for example tin containing adhesive material. It has to be note that the arrangement and the pattern configuration depend on the designer and the requirement. FIG. 3 shows other embodiments of the trench pattern according to the present invention. In a case, the depth of the connecting cavities 13 can be the same with that of the trenches 15. The cross sectional view of the connecting cavities 13, the trenches 15 can be any suitable shape. The connecting cavities 13 are respectively formed on the heat spreader 16, a portion of the trenches are formed to connect between the connecting cavities 13. Another portion of the trenches 15 lead to the edges of the heat spreader 16 from the connecting cavities 13.

The chip 14 is mounted on a chip receiving area on the top side surface 16b of the heat spreader 16 and in the opening 12e by using electrically conductive attach material 18 such as silver epoxy, glue layer or the like. Using conventional wire bonding techniques, the chip 14 is coupled to the conductive traces via signal transferring means such as conductive wires (bonding wires) 20. As aforesaid, the conductive traces are in the substrate for providing electrical connection path. The chip 14 is electrically coupled to the conductive traces by using the bonding wires 20. That is, one end of the bonding wire is connected to the chip 14 via a conductive pad array, another end of the bonding wire is connected to a BGA array 22 formed on the bottom side surface (second major surface) 12d of the substrate via the conductive traces.

A dielectric supporting member 24 having an opening 26 is formed on a portion of the top side surface (the first major surface) 12c of the substrate using an adhesive material, such as an insulating glue layer. The opening 26 is wider than the opening 12e and aligned to the opening 12e. The dielectric supporting member 24 occupies a major portion of substrate and leaves other portion for bonding wires 20. The dielectric supporting member 24 can be formed of isolation material or metal, such as aluminum, aluminum alloy, and copper. Alternatively, the supporting member is formed of metal, such as aluminum, aluminum alloy, copper, having an isolation layer 28 formed thereon. An anode process can be used to form the isolation layer 28.

In the present invention, the space among the substrate 12a, the chip 14, the heat spreader 16 and the dielectric supporting member 24 is encapsulated by encapsulating (compound) material 30 using encapsulating technique. Thus, the opening 12e and the opening 26 are filled with the encapsulating material 30 for protectively covering bonding wires 20 and the chip 14. Thus, the bonding wires 20 are electrically isolated by the encapsulating material 30.

Ball grid array (BGA), preferably, solder bumps (balls) 22, are formed on the bottom side surface 12d of the substrate by conventional positioning technique and using a solder reflow operation to form metallurgical bonds. The solder bumps 22 is used for electrically coupling to the chip 14. It is appreciate that metal alloy can be used to act the solder bumps 22. For example, the solder bumps 22 can be chosen from the group of 63Pb/37Sn, 62Pb/36Sn/2Ag etc. The melting point of the alloy is around 180 to 200 degrees centigrade.

Typically, at an end of each conductive trace in the substrate is connected to the solder bumps 22 via openings 34 formed in the dielectric tape layer 12b of the substrate. Conductive pads 36 are formed in the layer 12a and aligned to each opening 34. The conductive pads 36 are electrically connected between the solder bumps 22 and conductive traces in the first layer 12a of the substrate. The dimension of the diameter of the opening 34 is smaller than the dimension of the conductive pads 36. The cross sectional view of the opening 34 can be any suitable shape, such as circle or polygon. In preferred embodiment, the conductive traces and conductive pads 36 are made of copper or any conductive metal. Solder bumps 22 are terminal of a device which permit electrical signal transfer to the chip 14. In general, the solder bumps 22 are arranged in a matrix array configuration.

Figure 4:
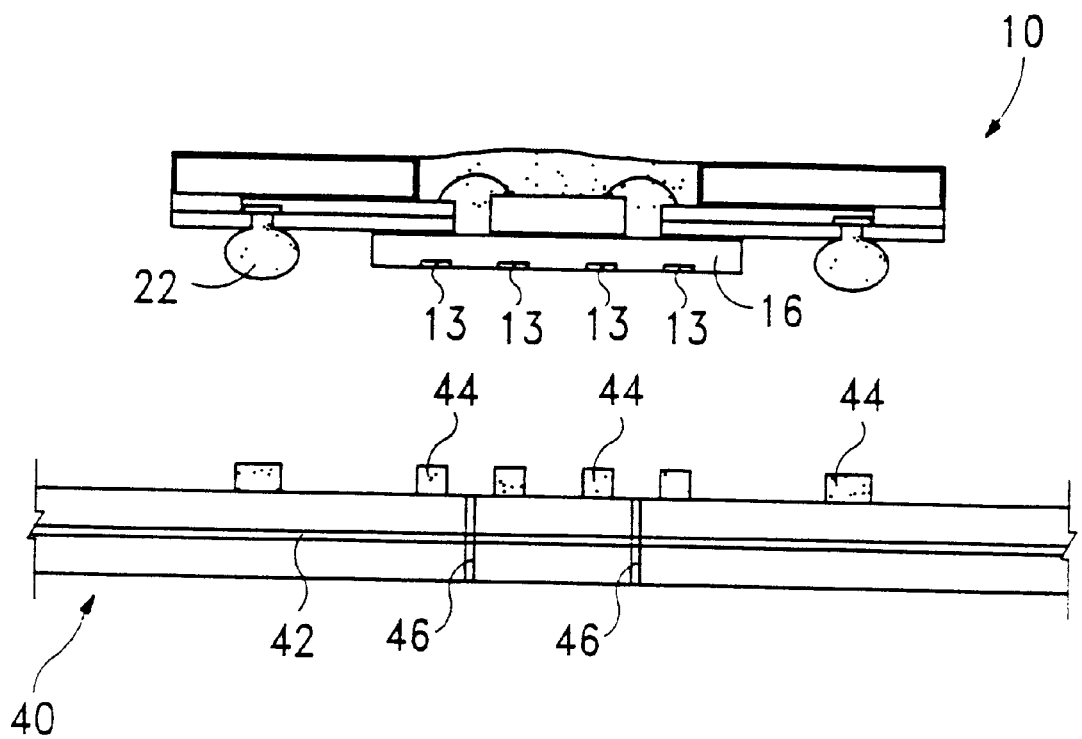
FIG. 4 shows how the package is set on a PCB.
Figure 5:
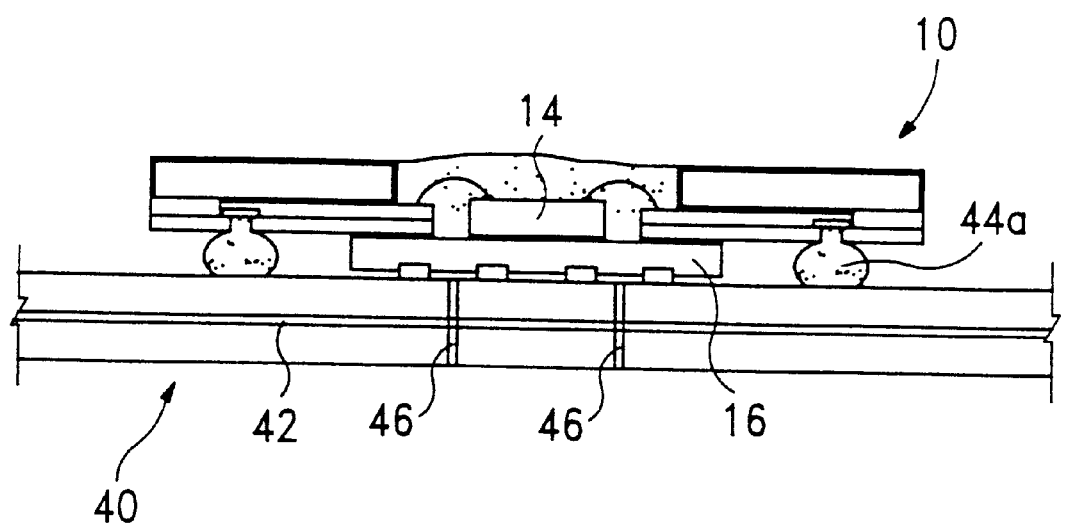
FIG. 5 is a cross sectional view illustrating a final structure after the package is set on the PCB.

FIG. 4 shows how the package 10 according to the present invention is set on a PCB. A PCB 40 can be seen in the scheme. The PCB 40 includes a ground plate 42 formed therein. A plurality of solder paste such as tin containing adhesive material 44 are formed on the surface of the PCB 40 and aligned to each connecting cavities 13 of the heat spreader 16. A plurality of conductive vias 46 are formed in the PCB 40 to connect the ground plate 42 and the solder paste 44. When a SMT process is perform to set the package 10 on the PCB 40. The connecting cavities 13 are connected to each solder paste 44. The gas generated during the SMT process is exhaust via the trenches 15. FIG. 5 is the final structure after the package 10 is set on the PCB 40. The heat generated by the chip 14 is spread by using the heat spreader 16 to transfer to PCB 40 via the conductive vias 46 and the ground plate 42. Further, the solder bumps 22 combines with the solder paste 44 to form solder joints 44a.

The chip 14 is attached on the heat spreader 16 instead of substrate. The heat is directly spread by the heat spreader 16. Additionally, the head spreader is connected to the ground plate 42 in the PCB 40. Therefore, the efficiency of spreading heat is improved. The scale (height) of the package 10 can be reduced due to the heat spreader 16 is formed under the chip 14 instead of forming on the chip 14. The present invention exhibits short signal transferring path. The conventional shape of the solder bumps 22 are depends on the weight of the package, surface tension of the solder bumps 22 and the capillary action. Thus, it is hard to control the shape of the solder bumps. In the present invention, the sinking problem of the solder bumps will be reduced by the control of the thickness of the heat spreader that is formed under the substrate. Thus, the present invention can keep solder bumps 22 with better shape. In order to increase the I/O numbers, the density of the solder bumps has to be increased and the space between the solder bumps has to be increased. As aforesaid, the first layer 12a of the substrate is formed of flexible PC that can exhibit the high density solder bumps and fine trace layout. Thus, the present invention can increase the I/O numbers of a package. The cost of the present is also lower than the conventional structure.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure. Thus, while the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A structure of a semiconductor package, said structure comprising:

a substrate having a conductive trace and a dielectric tape, wherein a first opening is formed in said substrate, and a plurality of second openings are formed in said dielectric tape;

a heat spreader attached to said dielectric tape;

a chip located in said first opening and attached to said heat spreader;

signal transferring means for connecting said conductive trace and said chip;

a dielectric supporting member adhered to said conductive trace;

encapsulating material filling a space between said substrate, said chip, said heat spreader and said dielectric supporting member; and a plurality of bumps corresponding to said second openings of said dielectric tape, and connected to said conductive trace.

2. The structure of claim 1, wherein said heat spreader has connecting cavities and trenches formed on a bottom surface of said heat spreader, said trenches being used for exhausting gas generated during SMT process, said connecting cavities being used to firmly connect said package to a printed circuit board (PCB), said chip being mounted on said heat spreader and in said first opening.

3. The structure of claim 1, wherein said dielectric supporting member is formed of isolation material.

4. The structure of claim 1, wherein said dielectric supporting member is formed of metal with an isolation layer formed thereon.

5. The structure of claim 1, further comprising conductive pads formed in said substrate aligned to said second openings.

6. The structure of claim 1, wherein a scale of said conductive pads is larger than a scale of a diameter of said second opening.

7. The structure of claim 2, wherein said connecting cavities are respectively formed on said heat spreader, a portion of said trenches leading to edges of said heat spreader from said connecting cavities.

8. The structure of claim 7, wherein a further portion of said trenches being connecting between said plurality of connecting cavities.

9. A structure of a semiconductor package, said structure comprising:

A substrate having a conductive trace and a dielectric tape, wherein a first opening is formed in said substrate, and a plurality of second openings are formed in said dielectric tape;

a heat spreader attached to said dielectric tape, wherein said heat spreader has a trench pattern formed thereon;

a chip located in said first opening and attached to said heat spreader;

signal transferring means for connecting said conductive trace and said chip;

a dielectric supporting member adhered to said conductive trace;

encapsulating material filling a space between said substrate, said chip, said heat spreader and said dielectric supporting member; and a plurality of bumps corresponding to said second openings of said dielectric tape, and connected said conductive trace.

10. The structure of claim 9, wherein said trench pattern includes connecting cavities and trenches, said trenches being formed on a bottom surface of said heat spreader, said trenches being used for exhausting gas generated during SMT process, said connecting cavities being used to firmly connect said package to a printed circuit board (PCB), said chip being mounted on said heat spreader and in said first opening.

11. The structure of claim 9, wherein said dielectric supporting member is formed of isolation material.

12. The structure of claim 9, wherein said dielectric supporting member is formed of metal with an isolation layer formed thereon.

13. The structure of claim 9, further comprising conductive pads formed in said substrate aligned to said second openings.

14. The structure of claim 9, wherein a scale of said conductive pads is larger than a scale of a diameter of said second opening.

15. The structure of claim 10, wherein said connecting cavities are respectively formed on said heat spreader, a portion of said trenches leading to edges of said heat spreader from said connecting cavities.

16. The structure of claim 15, wherein a further portion of said trenches being connecting between said plurality of connecting cavities.

* * * * *